United States Patent
Chan et al.

(10) Patent No.: US 7,485,518 B2
(45) Date of Patent: Feb. 3, 2009

(54) STRAINED SI MOSFET ON TENSILE-STRAINED SIGE-ON-INSULATOR (SGOI)

(75) Inventors: Kevin K. Chan, Staten Island, NY (US); Jack Q Chan, Manhasset Hills, NY (US); Kern Rim, Yorktown Heights, NY (US); Leathen Shi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 129 days.

(21) Appl. No.: 11/684,855

(22) Filed: Mar. 12, 2007

(65) Prior Publication Data
US 2007/0155130 A1   Jul. 5, 2007

Related U.S. Application Data

(62) Division of application No. 10/883,443, filed on Jul. 1, 2004, now Pat. No. 7,217,949.

(51) Int. Cl.
   *H01L 21/336* (2006.01)
(52) U.S. Cl. .................. 438/197; 438/459
(58) Field of Classification Search ........ 438/197, 438/199, 299, 455, 458, 459, 478
   See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |

(Continued)

FOREIGN PATENT DOCUMENTS

CN    1359158    7/2002

(Continued)

OTHER PUBLICATIONS

Rim, et al., "Transconductance Enhancement in Deep Submicron Strained-Si *n*—MOSFETs", International Electron Devices Meeting, 26, 8, 1, IEEE, Sep. 1998.

(Continued)

*Primary Examiner*—Tuan H Nguyen
(74) *Attorney, Agent, or Firm*—Scully, Scott, Murphy & Presser, P.C.; Ido Tuchman, Esq.

(57) ABSTRACT

A semiconductor structure for use as a template for forming high-performance metal oxide semiconductor field effect transistor (MOSFET) devices is provided. More specifically, the present invention provides a structure that includes a SiGe-on-insulator substrate including a tensile-strained SiGe alloy layer located atop an insulating layer; and a strained Si layer atop the tensile-strained SiGe alloy layer. The present invention also provides a method of forming the tensile-strained SGOI substrate as well as the heterostructure described above. The method of the present invention decouples the preference for high strain in the strained Si layer and the Ge content in the underlying layer by providing a tensile-strained SiGe alloy layer directly atop on an insulating layer.

1 Claim, 3 Drawing Sheets

U.S. PATENT DOCUMENTS

| | | | |
|---|---|---|---|
| 4,958,213 | A | 9/1990 | Eklund et al. |
| 5,006,913 | A | 4/1991 | Sugahara et al. |
| 5,060,030 | A | 10/1991 | Hoke |
| 5,081,513 | A | 1/1992 | Jackson et al. |
| 5,108,843 | A | 4/1992 | Ohtaka et al. |
| 5,134,085 | A | 7/1992 | Gilgen et al. |
| 5,310,446 | A | 5/1994 | Konishi et al. |
| 5,354,695 | A | 10/1994 | Leedy |
| 5,371,399 | A | 12/1994 | Burroughes et al. |
| 5,391,510 | A | 2/1995 | Hsu et al. |
| 5,459,346 | A | 10/1995 | Asakawa et al. |
| 5,471,948 | A | 12/1995 | Burroughes et al. |
| 5,557,122 | A | 9/1996 | Shrivastava et al. |
| 5,561,302 | A | 10/1996 | Candelaria |
| 5,565,697 | A | 10/1996 | Asakawa et al. |
| 5,571,741 | A | 11/1996 | Leedy |
| 5,592,007 | A | 1/1997 | Leedy |
| 5,592,018 | A | 1/1997 | Leedy |
| 5,670,798 | A | 9/1997 | Schetzina |
| 5,679,965 | A | 10/1997 | Schetzina |
| 5,683,934 | A | 11/1997 | Candelaria |
| 5,840,593 | A | 11/1998 | Leedy |
| 5,861,651 | A | 1/1999 | Brasen et al. |
| 5,880,040 | A | 3/1999 | Sun et al. |
| 5,940,736 | A | 8/1999 | Brady et al. |
| 5,946,559 | A | 8/1999 | Leedy |
| 5,960,297 | A | 9/1999 | Saki |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,059,895 | A | 5/2000 | Chu et al. |
| 6,066,545 | A | 5/2000 | Doshi et al. |
| 6,090,684 | A | 7/2000 | Ishitsuka et al. |
| 6,107,143 | A | 8/2000 | Park et al. |
| 6,117,722 | A | 9/2000 | Wuu et al. |
| 6,133,071 | A | 10/2000 | Nagai |
| 6,165,383 | A | 12/2000 | Chou |
| 6,221,735 | B1 | 4/2001 | Manley et al. |
| 6,228,694 | B1 | 5/2001 | Doyle et al. |
| 6,246,095 | B1 | 6/2001 | Brady et al. |
| 6,255,169 | B1 | 7/2001 | Li et al. |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,403,486 | B1 | 6/2002 | Lou |
| 6,403,975 | B1 | 6/2002 | Brunner et al. |
| 6,406,973 | B1 | 6/2002 | Lee |
| 6,461,936 | B1 | 10/2002 | Von Ehrenwall |
| 6,476,462 | B2 | 11/2002 | Shimizu et al. |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,652 | B2 | 1/2003 | Jan et al. |
| 6,509,618 | B2 | 1/2003 | Jan et al. |
| 6,521,964 | B1 | 2/2003 | Jan et al. |
| 6,531,369 | B1 | 3/2003 | Ozkan et al. |
| 6,531,740 | B2 | 3/2003 | Bosco et al. |
| 6,555,839 | B2 | 4/2003 | Fitzgerald |
| 6,573,126 | B2 | 6/2003 | Cheng et al. |
| 6,603,156 | B2 | 8/2003 | Rim |
| 6,713,326 | B2 | 3/2004 | Cheng et al. |
| 6,717,213 | B2 * | 4/2004 | Doyle et al. ................ 257/347 |
| 6,737,670 | B2 | 5/2004 | Cheng et al. |
| 6,805,962 | B2 | 10/2004 | Bedell et al. |
| 6,855,436 | B2 | 2/2005 | Bedell et al. |
| 6,861,158 | B2 | 3/2005 | Bedell et al. |
| 6,992,025 | B2 * | 1/2006 | Maa et al. .................... 438/795 |
| 7,161,169 | B2 * | 1/2007 | Chan et al. .................... 257/18 |
| 2001/0009784 | A1 | 7/2001 | Ma et al. |
| 2002/0074598 | A1 | 6/2002 | Doyle et al. |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2002/0167048 | A1 | 11/2002 | Tweet et al. |
| 2002/0168864 | A1 | 11/2002 | Cheng et al. |
| 2003/0032261 | A1 | 2/2003 | Yeh et al. |
| 2003/0040158 | A1 | 2/2003 | Saitoh |
| 2003/0057184 | A1 | 3/2003 | Yu et al. |
| 2003/0067035 | A1 | 4/2003 | Tews et al. |
| 2003/0139000 | A1 | 7/2003 | Bedell et al. |
| 2003/0172866 | A1 | 9/2003 | Hsu et al. |
| 2004/0018701 | A1 | 1/2004 | Ueda |
| 2004/0053477 | A1 | 3/2004 | Ghyselen et al. |
| 2004/0075141 | A1 | 4/2004 | Maeda et al. |
| 2004/0075143 | A1 | 4/2004 | Bae et al. |
| 2004/0087114 | A1 | 5/2004 | Xiang et al. |
| 2004/0178406 | A1 | 9/2004 | Chu |
| 2004/0206950 | A1 | 10/2004 | Suvkhanov et al. |
| 2004/0242006 | A1 | 12/2004 | Bedell et al. |
| 2005/0003229 | A1 | 1/2005 | Bedell et al. |
| 2005/0017236 | A1 | 1/2005 | Sugii et al. |

FOREIGN PATENT DOCUMENTS

| | | |
|---|---|---|
| EP | 0 967 636 A2 | 12/1999 |
| EP | 1 174 928 A1 | 1/2002 |
| JP | 1-162362 | 6/1989 |
| WO | WO 94/27317 | 5/1993 |
| WO | WO 02/454156 A2 | 6/2002 |

OTHER PUBLICATIONS

Rim, et al. "Characteristics and Device Design of Sub-100 nm Strained Si N- and PMOSFETs", 2002 Symposium on VLSI Technology Digest of Technical Papers, IEEE, pp. 98-99.

Scott, et al. "NMOS Drive Current Reduction Caused by Transistor Layout and Trench Isolation Induced Stress", International Electron Devices Meeting, 34.4.1, IEEE, Sep. 1999.

Ootsuka et al. "A Highly Dense, High-Performance 130nm node CMOS Technology for Large Scale System-on-a-Chip Application", International Electron Device Meeting, 23.5.1, IEEE, Apr. 2000.

Ito, et al. "Mechanical Stress Effect of Etch-Stop Nitride and its Impact on Deep Submicron Transistor Design", International Electron Devices Meeting, 10.7.1, IEEE, Apr. 2000.

Shimizu, et al. "Local Mechanical-Stress Control (LMC) : A New Technique for CMOS-Performance Enhancement", International Electron Devices Meeting, IEEE, Mar. 2001.

Ota, et al. "Novel Locally Strained Channel Technique for high Performance 55nm CMOS", International Electron Devices Meeting, 2.2.1. IEEE, Feb. 2002.

Ouyang, et al. "Two-Dimensional Bandgap Engineering in a Novel Si/SiGe pMOSFETS With Enhanced Device Performance and Scalability", Microelectronics Research Center, pp. 151-154, 2000 IEEE.

Sayama et al., "Effect of <Channel Direction for High Performance SCE Immune pMOSFFET with Less Than 0.15um Gate Length" ULSI Development Center, pp. 27.5.1-27.5.4, 1999 IEEE.

Taraschi, G., et al., "Relaxed SiGe-on-insulator fabricated via wafer bonding and etch back", J. Vac. Sci. Technol. B 20 (2), Mar./Apr. 2002.

* cited by examiner

STRAINED SI MOSFET ON TENSILE-STRAINED SIGE-ON-INSULATOR (SGOI)

RELATED APPLICATION

This application is a divisional of U.S. patent application Ser. No. 10/883,443, filed Jul. 1, 2004.

FIELD OF THE INVENTION

The present invention relates to a semiconductor structure for use as a template for forming high-performance metal oxide semiconductor field effect transistor (MOSFET) devices, and more particularly to a heterostructure comprising a strained Si layer on a tensile-strained SiGe-on-insulator (SGOI) substrate. The present invention also provides a method of forming the semiconductor heterostructure of the present invention.

BACKGROUND OF THE INVENTION

The phrase "strained silicon complementary metal oxide semiconductor (CMOS)" essentially refers to CMOS devices fabricated on substrates having a thin strained silicon (strained Si) layer on a relaxed silicon-germanium (SiGe) alloy layer. Electron and hole mobility in strained Si layers have been shown to be significantly higher than in bulk silicon layers, and MOSFETs with strained Si channels have been experimentally demonstrated to exhibit enhanced device performance compared to devices fabricated in conventional (unstrained) silicon substrates. Potential performance improvements include increased device drive current and transconductance, as well as the added ability to scale the operation voltage, without sacrificing circuit speed, in order to reduce power consumption.

Strained Si layers are the result of biaxial tensile stress induced in silicon grown on a substrate formed of a material whose lattice constant is greater than that of silicon. The lattice constant of germanium is about 4.2 percent greater than that of silicon, and the lattice constant of a SiGe alloy is linear with respect to its germanium concentration. As a result, the lattice constant of a SiGe alloy containing fifty atomic percent germanium is about 1.02 times greater than the lattice constant of silicon.

Epitaxial growth of Si on such a SiGe substrate will yield a Si layer under tensile strain, with the underlying SiGe substrate being essentially unstrained, or "relaxed." A structure and process that realize the advantages of a strained Si channel structure for MOSFET applications are taught in commonly-assigned U.S. Pat. No. 6,059,895 to Chu, et al., which discloses a technique for forming a CMOS device having a strained Si channel on a SiGe layer, all on an insulating substrate.

A difficulty in fully realizing the full advantages of strained Si CMOS technology is the presence of the relaxed SiGe layer under the strained Si layer. As indicated above, the strain in the Si channel depends on the lattice constant of the SiGe alloy layer. Thus, to increase strain and mobility, SiGe with an increased Ge content is needed. The use of a high Ge content (on the order of about 35 atomic % or greater) is however problematic in CMOS device fabrication in terms of chemistry. In particular, a SiGe layer having a high Ge content can interact with various processing steps, such as thermal oxidation, doping diffusion, salicide formation and annealing, such that it is difficult to maintain material integrity during CMOS fabrication, and may ultimately limit the device performance enhancements and device yield that can be achieved.

Co-assigned U.S. Pat. No. 6,603,156 to Rim discloses a method of forming a strained Si layer directly atop an insulator layer of a silicon-on-insulator substrate. The method disclosed in the '156 patent overcomes the drawbacks in the prior art by completely removing the SiGe alloy layer from the structure. Although the '156 patent provides an alternative to the problems of strained Si/relaxed SiGe heterostructures, there is still a need to provide a method that decouples the preference for high strain in the strained Si layer and the Ge content in the underlying SiGe alloy layer. Such a method would allow for continued use of strained Si/SiGe heterostructure technology.

SUMMARY OF THE INVENTION

The present invention provides a semiconductor structure for use as a template for forming high-performance metal oxide semiconductor field effect transistor (MOSFET) devices. More specifically, the present invention provides a heterostructure comprising a strained Si layer on a tensile-strained SiGe-on-insulator (SGOI). In broad terms, the structure of the present invention comprises:

a SiGe-on-insulator substrate comprising a tensile-strained SiGe alloy layer top an insulating layer; and a strained Si layer atop the tensile-strained SiGe alloy layer.

The present invention also provides a method of forming the tensile-strained SGOI substrate as well as the heterostructure described above. The method of the present invention decouples the preference for high strain in the strained Si layer and the Ge content in the underlying layer by providing a tensile-strained SiGe alloy layer directly atop on an insulating layer.

Specifically, and in broad terms, the method of the present invention the steps of:

forming a first multilayered structure comprising at least a tensile-strained SiGe alloy layer located above a relaxed SiGe alloy layer, wherein said tensile-strained SiGe alloy contains a lower Ge content than said relaxed SiGe alloy layer;

bonding said first multilayered structure to an insulating layer of a second multilayered structure on a surface opposite said relaxed SiGe alloy layer; and removing said relaxed SiGe alloy layer.

In some embodiments, a strained Si layer can be included within the first multilayered structure containing the tensile-strained SiGe alloy layer and the relaxed SiGe alloy layer. In such an embodiment, the strained Si layer is located between the tensile-strained SiGe alloy layer and the relaxed SiGe alloy layer. In this embodiment, and after removing the relaxed SiGe alloy layer, no further processing steps are needed in forming the strained Si layer on tensile-strained SiGe-on-insulator substrate.

In another embodiment, the tensile-strained SiGe alloy layer is formed directly atop the relaxed SiGe alloy layer. In this embodiment, a strained Si is formed atop the tensile-strained SiGe alloy layer following the removal of the relaxed SiGe alloy layer.

In some embodiments, at least one second semiconductor layer can be formed atop the tensile-strained SiGe alloy layer prior to bonding. This embodiment permits the formation of a multi-layered heterostructure.

After performing the above processing steps, at least one field effect transistor (FET) can be formed atop the strained Si layer.

DETAILED DESCRIPTION OF THE INVENTION

Figure 1A:
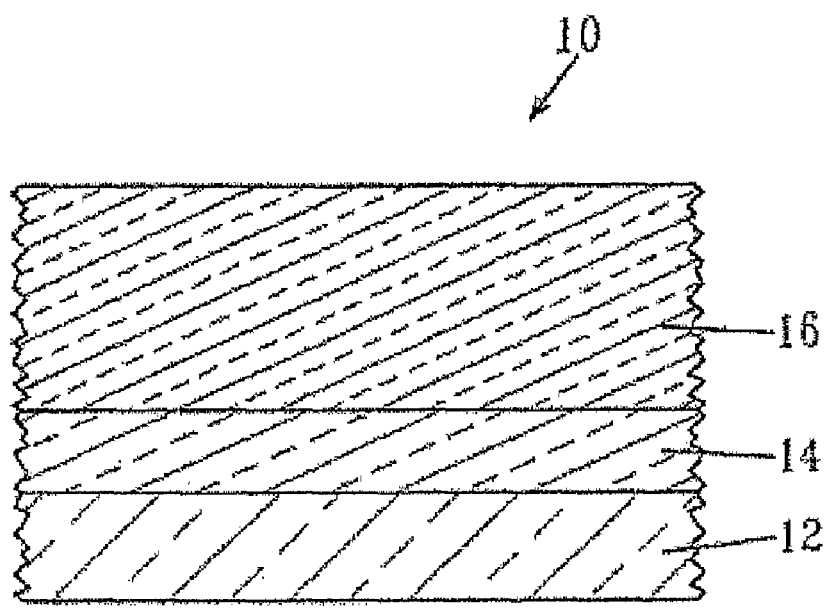
FIGS. 1A-1C are pictorial representations (through cross sectional views) illustrating the basic processing steps that are used in forming a structure containing a strained Si layer on a tensile-strained SiGe-on-insulator (SGOI) substrate.

The present invention, which provides a strained Si layer on a tensile-strained SiGe-on-insulator substrate as well as the method of fabricating the same, will now be described in greater detail by referring to the drawings that accompany the present application. In the drawings, which are not drawn to scale, like and/or corresponding elements are referred to by like reference numerals.

Figure 1B:
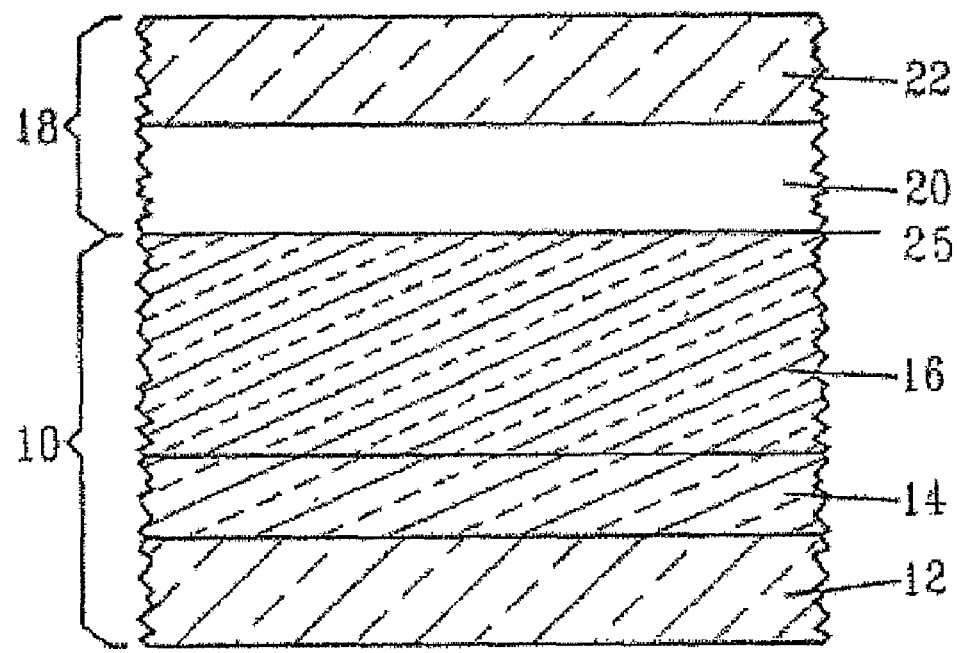
Figure 1C:
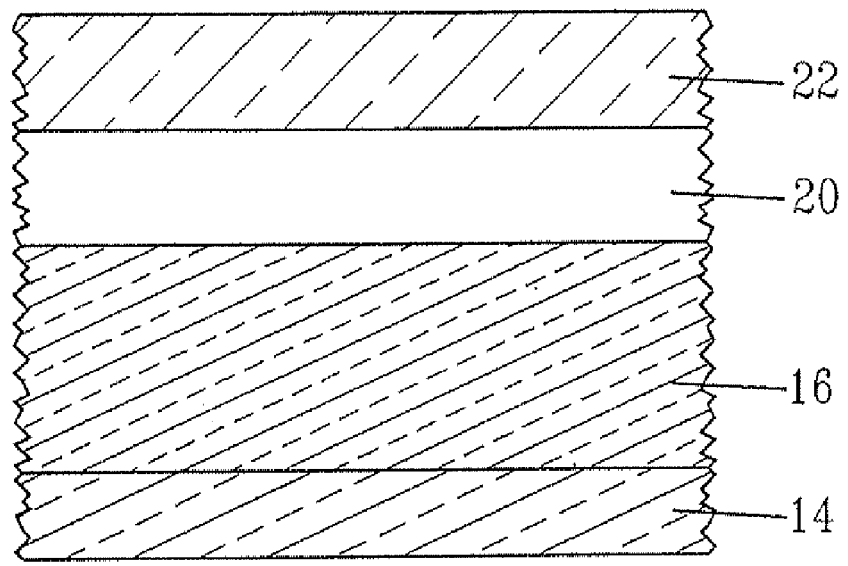

Reference is now made to FIGS. 1A-1C which illustrate basic processing steps that can be employed in the present invention for forming a strained Si layer on a tensile-strained SiGe-on-insulator substrate. Specifically, FIG. 1A illustrates a first multilayered structure 10 that comprises a relaxed SiGe alloy, $Si_{1-y}Ge_y$, layer 12, an optional strained Si layer 14 located on a surface of the relaxed SiGe alloy layer 12, and a tensile-strained SiGe alloy, $Si_{1-x}Ge_x$, layer 16 located on a surface of the optional strained Si layer 14. When the optional strained Si layer 14 is not present in the structure shown in FIG. 1A, the tensile-strained SiGe alloy layer 16 is located directly on a surface of the relaxed SiGe alloy layer 12.

In the above formulas and in accordance with the present invention, x is less than y, therefore the tensile-strained SiGe alloy layer 16 contains more silicon than the relaxed SiGe alloy layer 12. Hence, the tensile-strained SiGe alloy 16 has a lattice constant that is different from the lattice constant of the relaxed SiGe alloy layer 12. In particular, the lattice constant of the tensile-strained SiGe alloy layer 16 is less than the lattice constant for the relaxed SiGe alloy layer 12. Note that the lattice constant of the relaxed SiGe alloy layer 12 is typically greater than that of the strained Si layer 14 as well.

The first multilayered structure 10 shown in FIG. 1A is formed by first providing a relaxed SiGe alloy layer 12, as a substrate, in which a strained Si 14 and/or a tensile-strained SiGe alloy layer 16 are formed. The strained Si layer 14 is optional and need not be present within the first multilayered structure 10. The function of the relaxed SiGe alloy layer 12 is to induce biaxial tensile stresses that create a desired level of strain in layer 14 and/or layer 16. Because the relationship between the germanium concentration [Ge] and lattice constant is linear for SiGe alloys, the amount of strain induced in layer 14 and/or 16 can be tailored by the amount of germanium in the SiGe alloy layer 12.

The relaxed SiGe alloy layer 12 can be formed by known methods including, for example, epitaxial growth, Czhochralski growth and the like. Because SiGe alloy layer 12 has a greater lattice constant than silicon, layers 14 and 16 are under biaxial tension, while the underlying SiGe alloy layer 12 remains substantially unstrained, or "relaxed." The thickness of the relaxed SiGe alloy layer 12 employed in the present invention may vary depending on the method used in forming the same. Typically, however, the relaxed SiGe alloy layer 12 has a thickness from about 50 to about 5000 nm, with a thickness from about 200 to about 3000 nm being more typical.

After providing relaxed SiGe alloy layer 12, a strained Si layer 14 can be optionally formed on a surface of the relaxed SiGe alloy layer 12. The strained Si layer 14 is formed by any conventional epitaxial growth process. The thickness of strained Si layer 14 is typically from about 2 to about 40 nm, with a thickness from about 10 to about 25 nm being more typical. The strained Si layer 14 formed in the present invention typically has an in-plane lattice constant that is from about 0.01 to about 4.2% larger than the natural lattice constant of Si.

Next, a tensile-strained SiGe alloy layer 16 is formed on either a surface of the strained Si layer 14, such as shown in FIG. 1A, or directly on a surface of the relaxed SiGe alloy layer 12 (not shown), when strained Si layer 14 is not present. The tensile-strained SiGe alloy layer 16 can be formed by any conventional method including, for example, epitaxial growth. The tensile-strained SiGe alloy layer 16 formed at this point of the present invention typically has a thickness from about 5 to about 300 nm, with a thickness from about 10 to about 100 nm being more typical. The tensile-strained SiGe alloy layer 16 typically contains a Ge content from about 1 to about 99 atomic percent Ge, with the proviso that the Ge content is less than the Ge content in the relaxed SiGe alloy layer 12.

Figure 3:
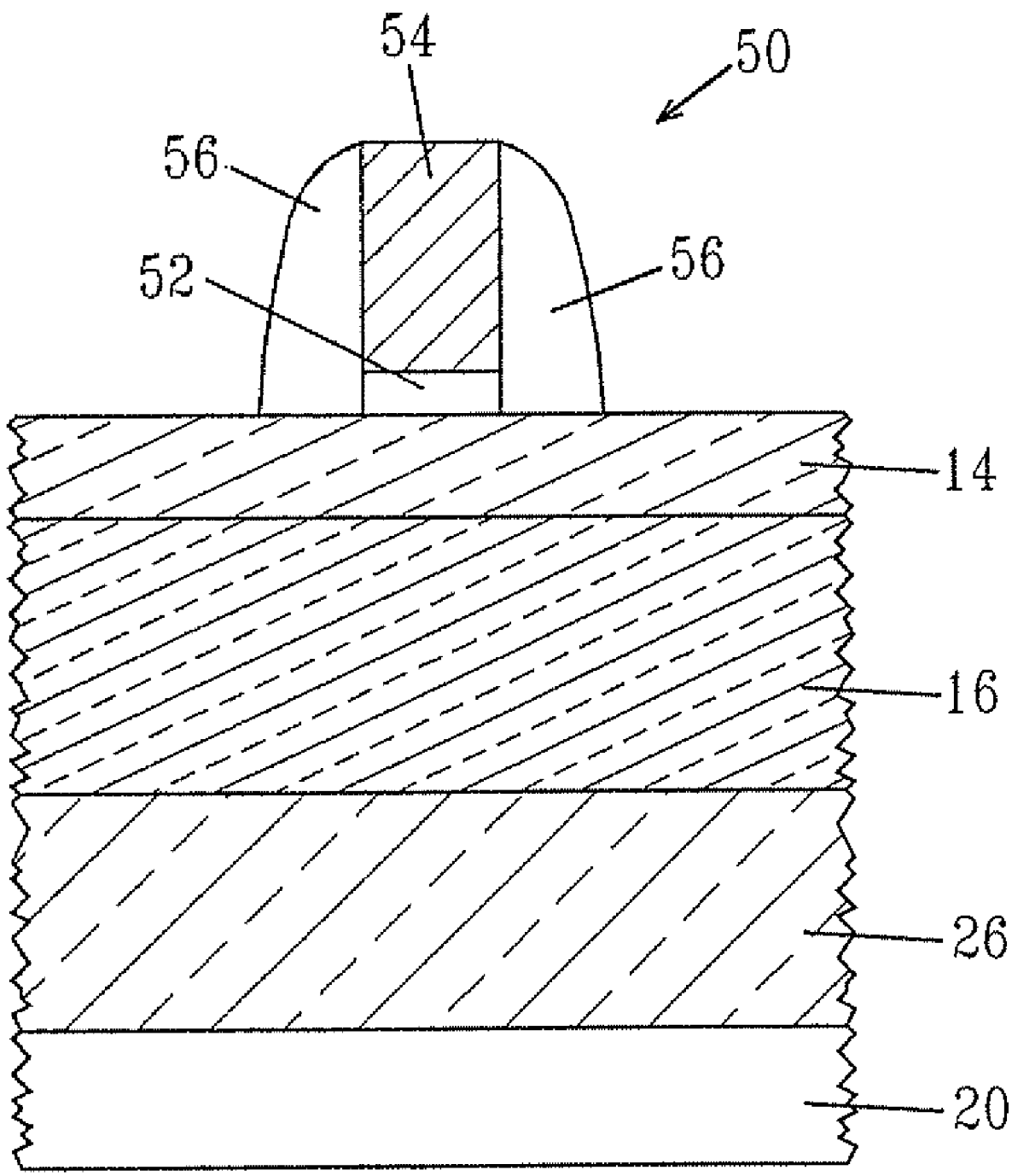
FIG. 3 is a pictorial representation (through a cross sectional view) illustrating a FET formed atop an alternative structure that can be made using the processing steps shown in FIGS. 1A-1C.

Although not shown in the process flow of FIGS. 1A-1C, one or more optional second semiconductor layers can be formed at this point of the present invention atop the tensile-strained SiGe alloy layer 16. The one or more optional semiconductor layers can be formed utilizing a conventional deposition process known to those skilled in the art including, for example, epitaxial growth, chemical vapor deposition, evaporation, plasma-enhanced chemical vapor deposition and the like. Illustrative examples of one or more optional semiconductor layers that can be formed at this point of the present invention include, but are not limited to: Si, SiGe, Ge, GaAs, InAs, InP or other III/V and II/VI compound semiconductors, including multilayers thereof. The thickness of the one or more optional second semiconductor layers varies depending on the number of second semiconductor materials employed. Typically, the one or more second semiconductor layers has a total thickness from about 5 to about 300 nm, with a total thickness from about 10 to about 100 nm being more typical. The presence of the one or more optional second semiconductor layers permits the formation of a structure containing multiple heterostructure layers. FIG. 3 shows the presence of a second semiconductor material. In this drawing, the second semiconductor material is labeled as reference numeral 26.

After providing the first multilayered structure 10 shown in FIG. 1A, a second multilayered structure 18 (see FIG. 1B) is formed which includes an insulating layer 20 on a substrate 22, which at least initially serves as a handle wafer for the insulating layer 20. As will become apparent from the following, it is foreseeable that one or more layers of various materials could be included between the insulating layer 20 and substrate 22 or on the backside of the substrate 22 (opposite the insulating layer 20).

Insulating layer 20 comprises an oxide, nitride, oxynitride or any combination thereof. Illustrative examples of materials that can be used as insulating layer 20 include, but are not limited to: silicon oxide (silica, $SiO_2$), silicon nitride (SiN), aluminum oxide (alumina; $Al_2O_3$), silicon oxynitride, hafnium oxide (hafnia, $HfO_2$), zirconium oxide (zirconia, $ZrO_2$), and doped aluminum oxide. Preferably, the insulating layer 20 is an oxide. The thickness of insulating layer 20 is typically from about 1 to about 1000 nm, with a thickness from about 10 to about 300 nm being more typical. The insulating layer 20 is formed on a surface of substrate 22 using a conventional deposition process such as, for example, CVD, PECVD, evaporation chemical solution deposition, atomic layer deposition and the like. Alternatively, the insulating layer 20 can be formed atop the substrate 22 by thermal oxidation, thermal nitridation or a combination thereof.

The substrate 22 employed in the present invention is comprised of any semiconducting material including, for example, Si, SiGe, Ge, GaAs, InAs, InP, and other III/V or II/VI compound semiconductors. Substrate 22 can also be comprised of a layered semiconductor such as Si/SiGe or a preformed silicon-on-insulator (SOI) or SiGe-on-insulator (SGOI) substrate. The thickness of the substrate 22 is inconsequential to the present invention.

It should be noted that the semiconductor materials employed as layers 12, 14, 16, 22 can have the same crystal orientation or they can have different crystal orientations.

The second multilayered structure 18 is bonded to the first multilayered structure 10 so as to provide a bonded structure as is depicted in FIG. 1B. A bonding interface 25 is located between layers 20 and 16 due to the bonding process described hereinbelow; note that the bonding interface 25 is shown in FIG. 1B only and is then omitted from the remaining drawings for clarity. Specifically, an exposed upper surface of the insulating layer 20 of the second multilayered structure 18 is bonded to the exposed upper surface of the tensile-strained SiGe alloy layer 16 of multilayered structure 10.

The bonding between the two multilayered structure includes any conventional bonding method which includes semiconductor-to-insulator bonding. For example, bonding of the above described two multilayered structures can be achieved in the present invention by first bringing the two structures into intimate contact with other; and optionally applying an external force to the contacted structures. The two multilayered structures can be optionally annealed after contacting under conditions that are capable of increasing the bonding energy between the two structures. The annealing step may be performed in the presence or absence of an external force. Bonding is achieved typically during the initial contact step at nominal room temperature. By nominal room temperature, it is meant a temperature from about 15° C. to about 40° C., with a temperature of about 25° C. being more preferred. Although bonding is typically performed at these temperatures, other temperatures above nominal are also contemplated herein.

After bonding, the bonded structure can be further annealed to enhance the bonding strength and improve the interface property. The further annealing temperature is typically carried out at a temperature from about 900° to about 1300° C., with an annealing temperature from about 1000° to about 1100° C. being more typical. Annealing is performed within the aforementioned temperature ranges for various time periods that may range from about 1 hour to about 24 hours. The annealing ambient can be $O_2$, $N_2$, Ar, or a low vacuum, with or without external adhesive forces. Mixtures of the aforementioned annealing ambients, with or without an inert gas, are also contemplated herein. Although high-temperature annealing (as described above) is often used, it is also possible to use a low temperature anneal (less than 900° C.) which can also achieve good mechanical and electrical properties.

After forming the bonded structure shown in FIG. 1B, the relaxed SiGe layer 12 is removed from the structure to expose either the underlying strained Si layer 14, if present, or the tensile-strained SiGe alloy layer 16, if the strained Si layer 14 is not present. FIG. 1C depicts a structure in which the strained Si layer 14 is exposed after removal of the relaxed SiGe alloy layer 12.

The relaxed SiGe alloy layer 12 is completely removed by a method such as chemical-mechanical polishing (CMP), wafer cleaving (such as a SmartCut process available from LETI), a chemical etching process that is selective to silicon, or a combination of these techniques. When strained Si layer 14 is present, the preferred method for completely removing the relaxed SiGe layer 12 is by a selective chemical etching process such as HHA (hydrogen peroxide, hydrofluoric acid, acetic acid) etching, which preferentially etches the SiGe alloy layer 12. CMP or wafer cleaving a typically performed when the relaxed SiGe alloy layer 12 is in direct contact with the tensile-strained SiGe alloy layer 16. If the SmartCut process is used, a hydrogen implant step required by this process can be performed at various points during the process of the present invention.

In embodiments in which the strained Si layer 14 is not previously present, the strained Si layer 14 can be formed atop the exposed tensile-strained SiGe alloy layer 16 at this point of the present invention by epitaxial growth.

Figure 2:
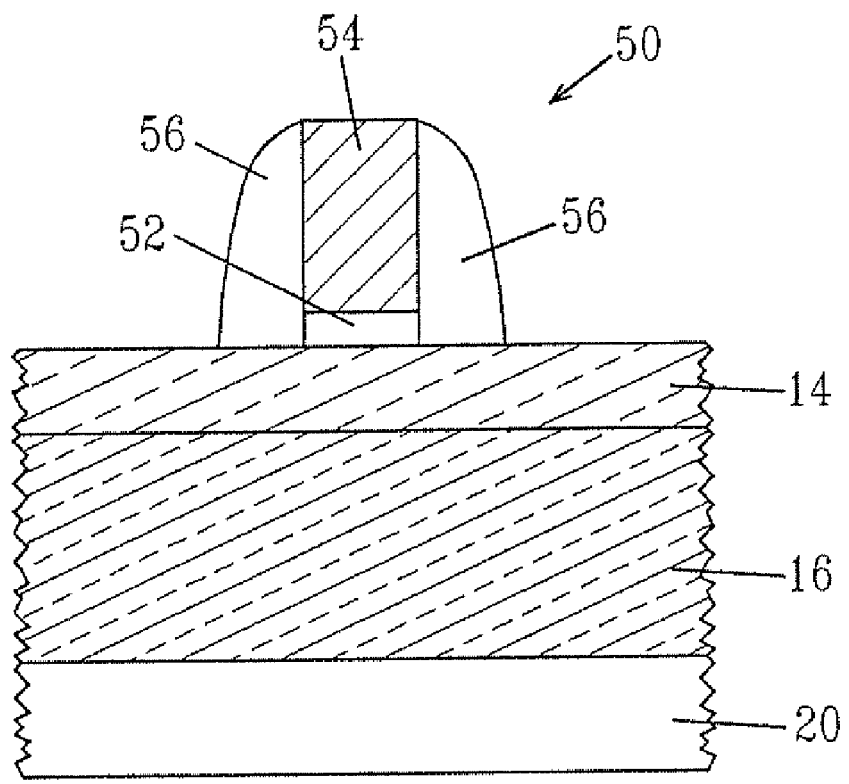
FIGS. 2 is a pictorial representation (through a cross sectional view) illustrating a FET formed atop the structure provided in FIGS. 1A-1C.

Following formation of the strained Si—SGOI structure, one or more field effect transistors (FETs) can be formed atop the surface of the strained Si layer 14 providing the structure shown in FIGS. 2 and 3. In these drawings, substrate 22 has been omitted for clarity, reference numeral 50 denotes the FET region, reference numeral 52 denotes a gate dielectric, reference numeral 54 denotes a gate conductor and reference numeral 56 denotes a sidewall spacer. The FET 50 is formed atop the strained Si layer 14 using conventional CMOS processing steps that are well known to those skilled in the art. The materials for gate dielectric 52 (oxide, nitride, oxynitride or combinations thereof), gate conductor 54 (polySi, metals, metal alloys, silicides or combinations thereof), and sidewall spacer 56 (oxide, nitride, oxynitride or combination thereof) are well known to those skilled in the art. The portion of the strained Si layer 14 underlying the gate region 50 serves as the device channel. Source/drain extension and diffusion regions (not shown) can be formed into the strained Si layer 14 by conventional ion implantation and annealing. Silicide contacts and/or raised source/drain regions can also be formed by conventional methods well known to one skilled in the art. Following the above processing steps, conventional back-end-of the line (BEOL) processing can also be performed on the structures shown in FIGS. 2 and 3. The illustrated structures shown in FIGS. 2 and 3 are identical except for the present of a second semiconductor layer 26 between the tensile-strained SiGe alloys layer 16 and insulating layer 20.

It is emphasized that the method of the present invention described above decouples the preference for high strain in the strained Si layer 14 and the Ge content in the underlying tensile-strained SiGe alloy layer 16. In the structures shown in FIGS. 2 and 3, the tensile-strained SiGe alloy layer 16 underlying the strained Si layer 14 serves as a template for stain in layer 14.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

What we claim is:

1. A method of forming a semiconductor structure comprising:

forming a first multilayered structure comprising a relaxed SiGe alloy layer, a biaxial tensile strained Si layer located on a surface of said relaxed SiGe alloy layer, and a tensile-strained epitxial SiGe alloy layer located on a surface of said biaxial tensile strained Si layer, wherein said tensile-strained epitxial SiGe alloy contains a lower Ge content than said relaxed SiGe alloy layer;

bonding said first multilayered structure to an insulating layer of a second multilayered structure on a surface opposite said relaxed SiGe alloy layer, said bonding includes contacting said first multilayered structure and said second multilayered structure and annealing, wherein said contacting is performed in the presence of an external force and at a temperature from about 15° to about 40° C;

removing said relaxed SiGe alloy layer to expose a surface of said biaxial tensile strained Si layer; and forming at least one field effect transistor on said biaxial tensile strained Si layer.

* * * * *